(12) United States Patent
Shifren et al.

(10) Patent No.: US 9,224,733 B2
(45) Date of Patent: Dec. 29, 2015

(54) SEMICONDUCTOR STRUCTURE AND METHOD OF FABRICATION THEREOF WITH MIXED METAL TYPES

(71) Applicant: MIE Fujitsu Semiconductor Limited, Kuwana (JP)

(72) Inventors: Lucian Shifren, San Jose, CA (US); Pushkar Ranade, Los Gatos, CA (US); Sachin R. Sonkusale, Los Gatos, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 62 days.

(21) Appl. No.: 14/046,234

(22) Filed: Oct. 4, 2013

(65) Prior Publication Data

US 2014/0035060 A1    Feb. 6, 2014

Related U.S. Application Data

(63) Continuation of application No. 12/960,266, filed on Dec. 3, 2010, now Pat. No. 8,569,128.

(60) Provisional application No. 61/357,002, filed on Jun. 21, 2010.

(51) Int. Cl.
*H01L 27/092*   (2006.01)
*H01L 21/8238*  (2006.01)

(52) U.S. Cl.
CPC ...... *H01L 27/092* (2013.01); *H01L 21/823807* (2013.01); *H01L 21/823842* (2013.01); *H01L 27/0922* (2013.01)

(58) Field of Classification Search
CPC ................... H01L 21/823842; H01L 27/0922

USPC .................................................. 257/404, 407
See application file for complete search history.

(56) References Cited

U.S. PATENT DOCUMENTS 3,958,266 A    5/1976   Athanas
4,000,504 A    12/1976  Berger
(Continued)

FOREIGN PATENT DOCUMENTS

EP    0274278    7/1988
EP    0312237    4/1989
(Continued)

OTHER PUBLICATIONS

Lavéant, P. "Incorporation, DiffUS CONlion and Agglomeration of Carbon in Silicon", Solid State Phenomena, vols. 82-84, pp. 189-194, 2002.
(Continued)

*Primary Examiner* — Matthew W Such
*Assistant Examiner* — Abul Kalam
(74) *Attorney, Agent, or Firm* — Baker Botts L.L.P.

(57) ABSTRACT

A semiconductor structure includes a first PMOS transistor element having a gate region with a first gate metal associated with a PMOS work function and a first NMOS transistor element having a gate region with a second metal associated with a NMOS work function. The first PMOS transistor element and the first NMOS transistor element form a first CMOS device. The semiconductor structure also includes a second PMOS transistor that is formed in part by concurrent deposition with the first NMOS transistor element of the second metal associated with a NMOS work function to form a second CMOS device with different operating characteristics than the first CMOS device.

20 Claims, 11 Drawing Sheets

(56) References Cited

U.S. PATENT DOCUMENTS

| | | | |
|---|---|---|---|
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,082 B1 * | 10/2001 | Lin .................. H01L 21/823807 257/E21.443 |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucca et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara |
| 6,787,424 B1 | 9/2004 | Yu |

(56) References Cited

U.S. PATENT DOCUMENTS

| | | |
|---|---|---|
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perug et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bertstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |

(56) References Cited

U.S. PATENT DOCUMENTS

| | | |
|---|---|---|
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,943,462 B1 | 5/2011 | Beyer et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,294,180 B2 | 10/2012 | Doyle et al. |
| 8,299,562 B2 | 10/2012 | Li et al. |
| 8,324,059 B2 | 12/2012 | Guo et al. |
| 8,372,721 B2 | 2/2013 | Chen et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara |
| 2003/0173626 A1 | 9/2003 | Burr |
| 2003/0183856 A1 | 10/2003 | Wieczorek |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2007/0246708 A1* | 10/2007 | Mori ............... H01L 21/823842 257/59 |
| 2008/0067589 A1 | 3/2008 | Ito et al. |
| 2008/0100208 A1 | 5/2008 | Arevalo et al. |
| 2008/0160736 A1* | 7/2008 | Alshareef ....... H01L 21/823857 438/585 |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0233694 A1* | 9/2008 | Li ..................... H01L 21/28194 438/216 |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0011537 A1 | 1/2009 | Shimizu et al. |
| 2009/0057746 A1 | 3/2009 | Sugll et al. |
| 2009/0108350 A1 | 4/2009 | Cai et al. |
| 2009/0108373 A1* | 4/2009 | Frank ..................... H01L 27/11 257/392 |
| 2009/0134468 A1 | 5/2009 | Tsuchiya et al. |

(56) References Cited

U.S. PATENT DOCUMENTS

| | | | |
|---|---|---|---|
| 2009/0224319 A1 | 9/2009 | Kohli | |
| 2009/0302388 A1 | 12/2009 | Cai et al. | |
| 2009/0309140 A1 | 12/2009 | Khamankar et al. | |
| 2009/0311837 A1 | 12/2009 | Kapoor | |
| 2009/0321849 A1 | 12/2009 | Miyamura et al. | |
| 2010/0012988 A1 | 1/2010 | Yang et al. | |
| 2010/0038724 A1 | 2/2010 | Anderson et al. | |
| 2010/0100856 A1 | 4/2010 | Mittal | |
| 2010/0148153 A1 | 6/2010 | Hudait et al. | |
| 2010/0149854 A1 | 6/2010 | Vora | |
| 2010/0187641 A1 | 7/2010 | Zhu et al. | |
| 2010/0207182 A1 | 8/2010 | Paschal | |
| 2010/0270600 A1 | 10/2010 | Inukai et al. | |
| 2011/0042751 A1* | 2/2011 | Kim | H01L 21/82345 257/369 |
| 2011/0059588 A1 | 3/2011 | Kang | |
| 2011/0073961 A1 | 3/2011 | Dennard et al. | |
| 2011/0074498 A1 | 3/2011 | Thompson et al. | |
| 2011/0079860 A1 | 4/2011 | Verhulst | |
| 2011/0079861 A1 | 4/2011 | Shifren et al. | |
| 2011/0095811 A1 | 4/2011 | Chi et al. | |
| 2011/0147828 A1 | 6/2011 | Murthy et al. | |
| 2011/0169082 A1 | 7/2011 | Zhu et al. | |
| 2011/0175170 A1 | 7/2011 | Wang et al. | |
| 2011/0180880 A1 | 7/2011 | Chudzik et al. | |
| 2011/0186937 A1* | 8/2011 | Scheiper | H01L 21/28088 257/402 |
| 2011/0193164 A1 | 8/2011 | Zhu | |
| 2011/0198699 A1* | 8/2011 | Hung | H01L 27/11 257/369 |
| 2011/0212590 A1 | 9/2011 | Wu et al. | |
| 2011/0230039 A1 | 9/2011 | Mowry et al. | |
| 2011/0242921 A1 | 10/2011 | Tran et al. | |
| 2011/0248352 A1 | 10/2011 | Shifren | |
| 2011/0284972 A1* | 11/2011 | Lee | G11C 11/412 257/369 |
| 2011/0294278 A1 | 12/2011 | Eguchi et al. | |
| 2011/0309447 A1 | 12/2011 | Arghavani et al. | |
| 2012/0007194 A1 | 1/2012 | Sakakidani et al. | |
| 2012/0021594 A1 | 1/2012 | Gurtej et al. | |
| 2012/0034745 A1 | 2/2012 | Colombeau et al. | |
| 2012/0056275 A1 | 3/2012 | Cai et al. | |
| 2012/0065920 A1 | 3/2012 | Nagumo et al. | |
| 2012/0108050 A1 | 5/2012 | Chen et al. | |
| 2012/0132998 A1 | 5/2012 | Kwon et al. | |
| 2012/0138953 A1 | 6/2012 | Cai et al. | |
| 2012/0146148 A1 | 6/2012 | Iwamatsu | |
| 2012/0146155 A1 | 6/2012 | Hoentschel et al. | |
| 2012/0167025 A1 | 6/2012 | Gillespie et al. | |
| 2012/0187491 A1 | 7/2012 | Zhu et al. | |
| 2012/0190177 A1 | 7/2012 | Kim et al. | |
| 2012/0223363 A1 | 9/2012 | Kronholz et al. | |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-μm CMOS for Mixed Digital and Analog Aplications with Zero-Volt-Vth Expitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Tochnotogy Journal Q3 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bult to SOI to Bulk", IEEE Transactions on Electron Devices, vol. 39, No. 7, Jul. 1992.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans, 2006, vol. 3, Issue 7, pp. 947-961, 2006

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposoium, pp. 29.1.1-29.1.4, 2009.

Holland, OW and Thomas, DK "A Method to improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Samsudin, K et al., "Integrating Intrinsic Parameter Fluctuation Description into BSIMSOI to Forcast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

Banerjee, et al. "Compensating Non-Optical Effects using Electrically-Driven Optical Proximity Correction", Proc. of SPIE vol. 7275 7575OE, 2009.

Cheng, et al. "Extremely Thin SOI (ETSOI) CMOS with Record Low Variability for Low Power Systems-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-

(56) References Cited

OTHER PUBLICATIONS

Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 1,2 µm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

US 7,011,991, 03/2006, Li (withdrawn)

\* cited by examiner

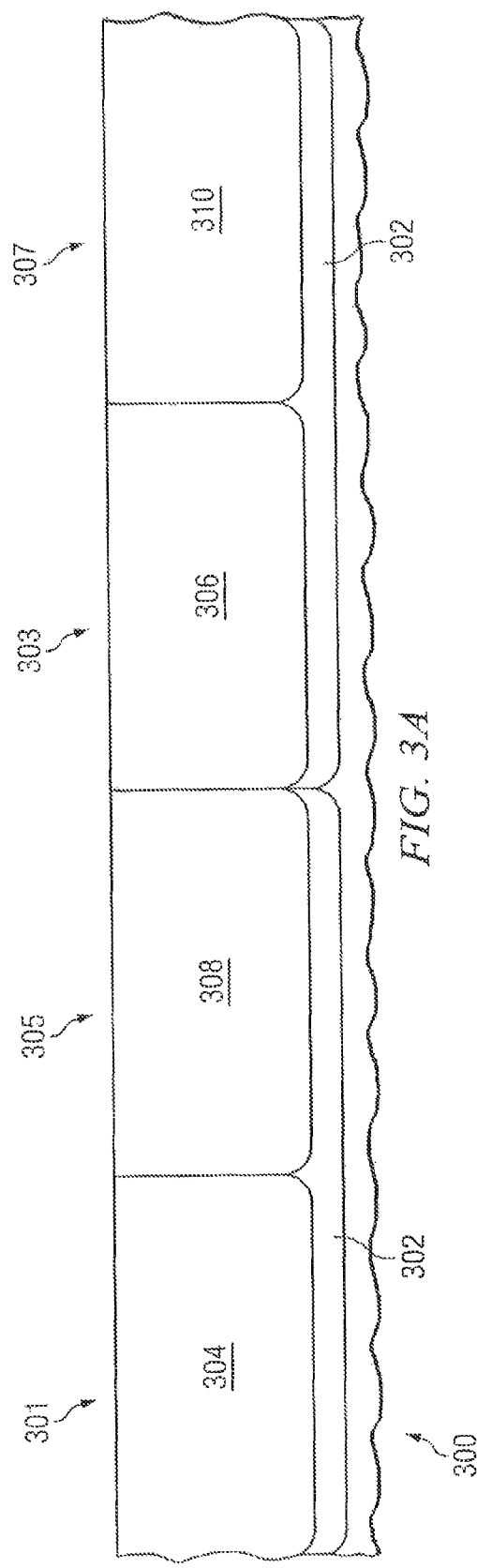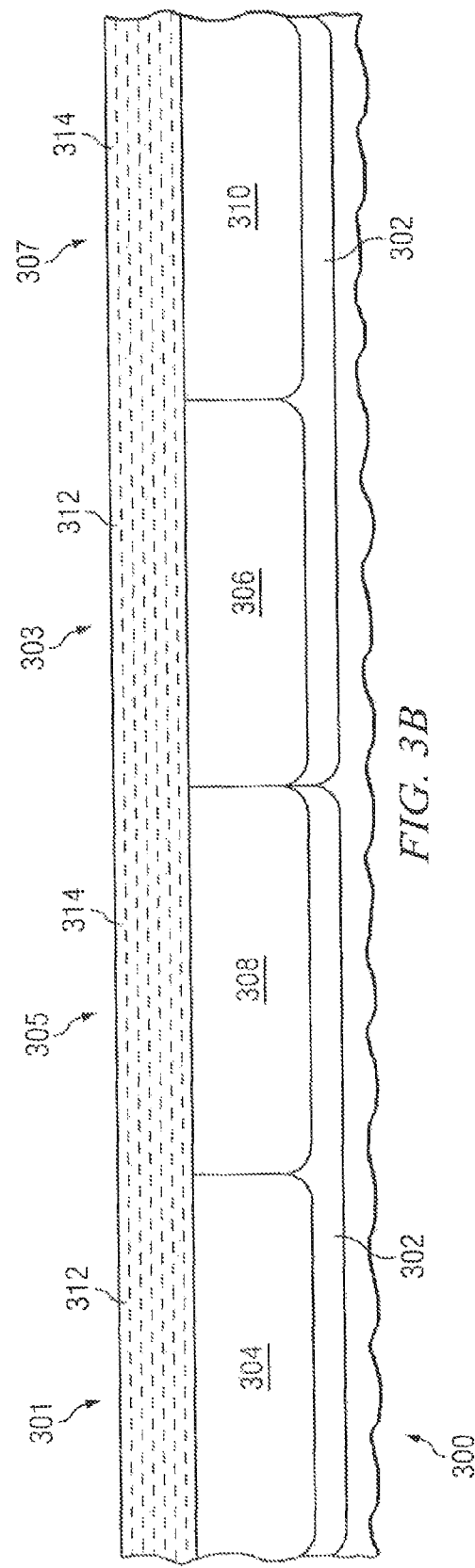

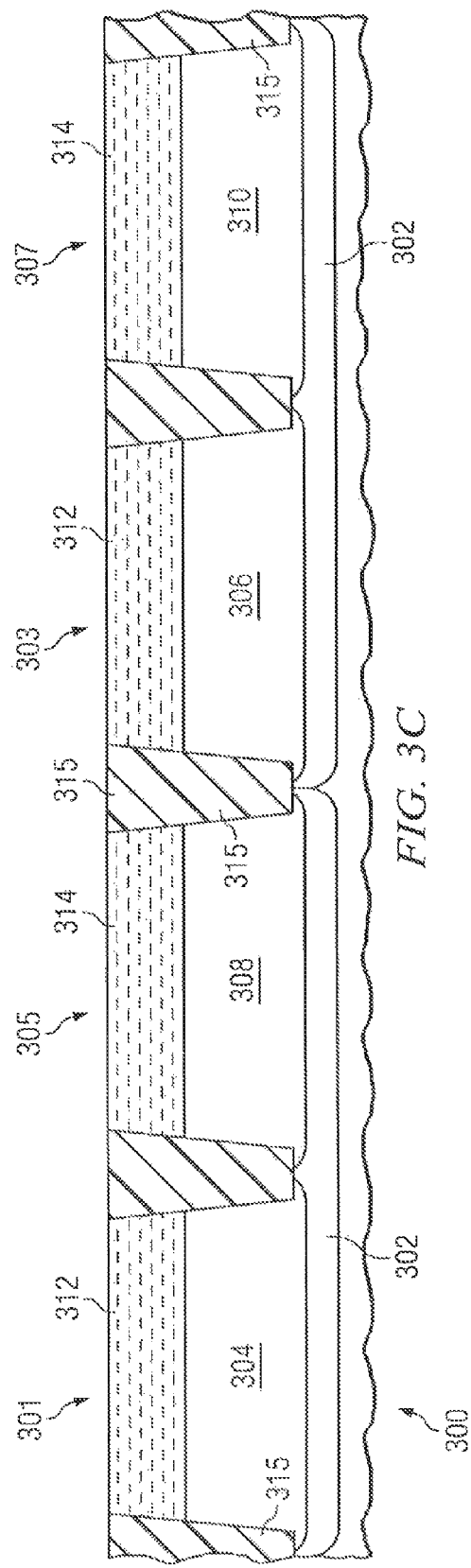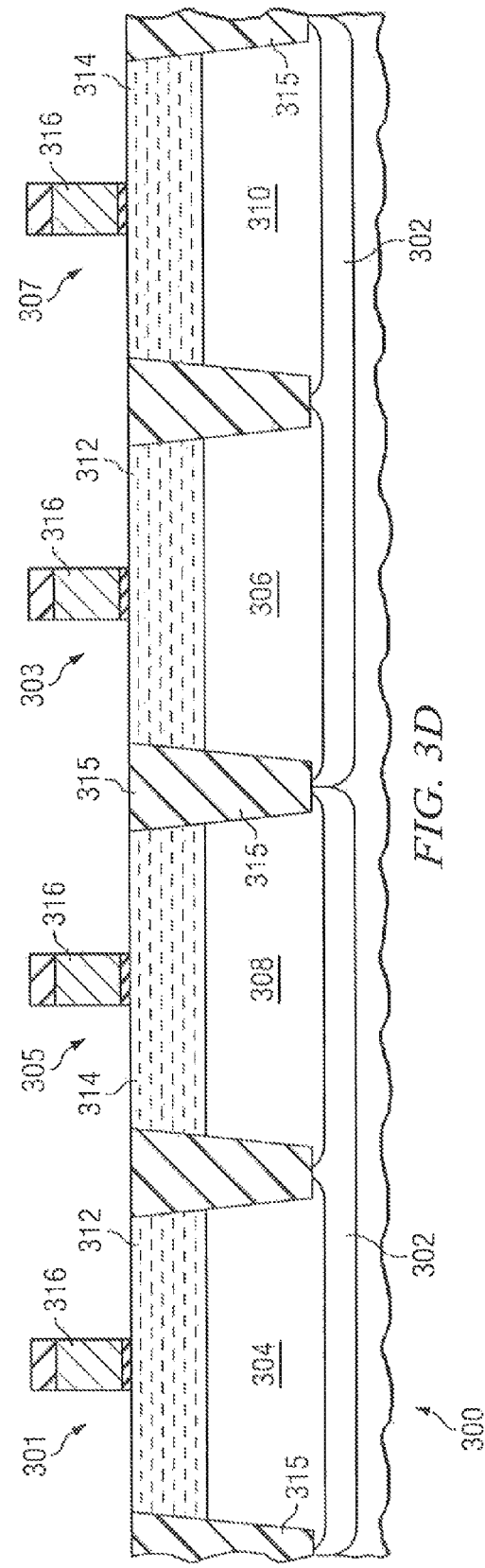
FIG. 3C
FIG. 3D

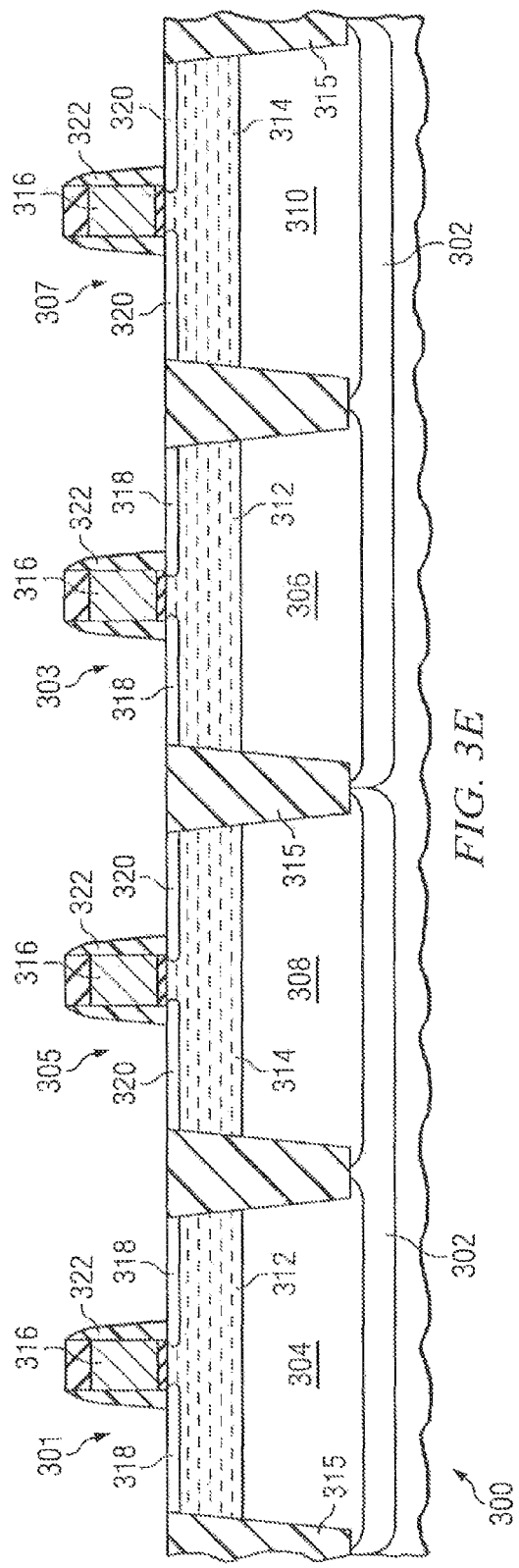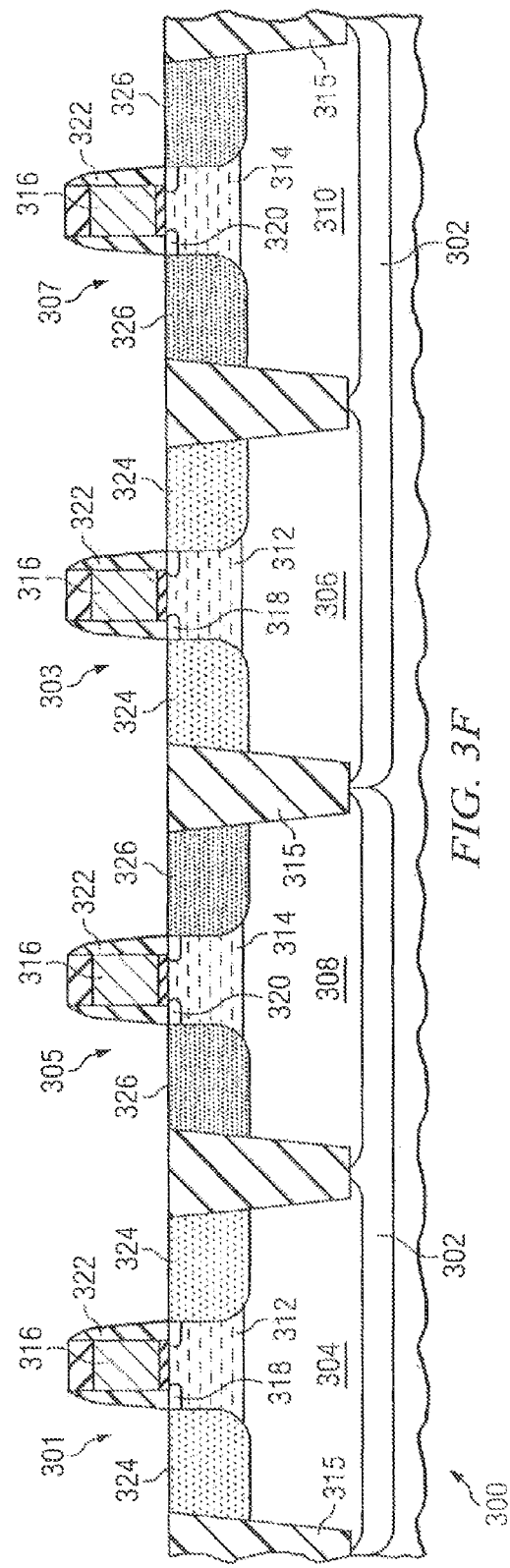

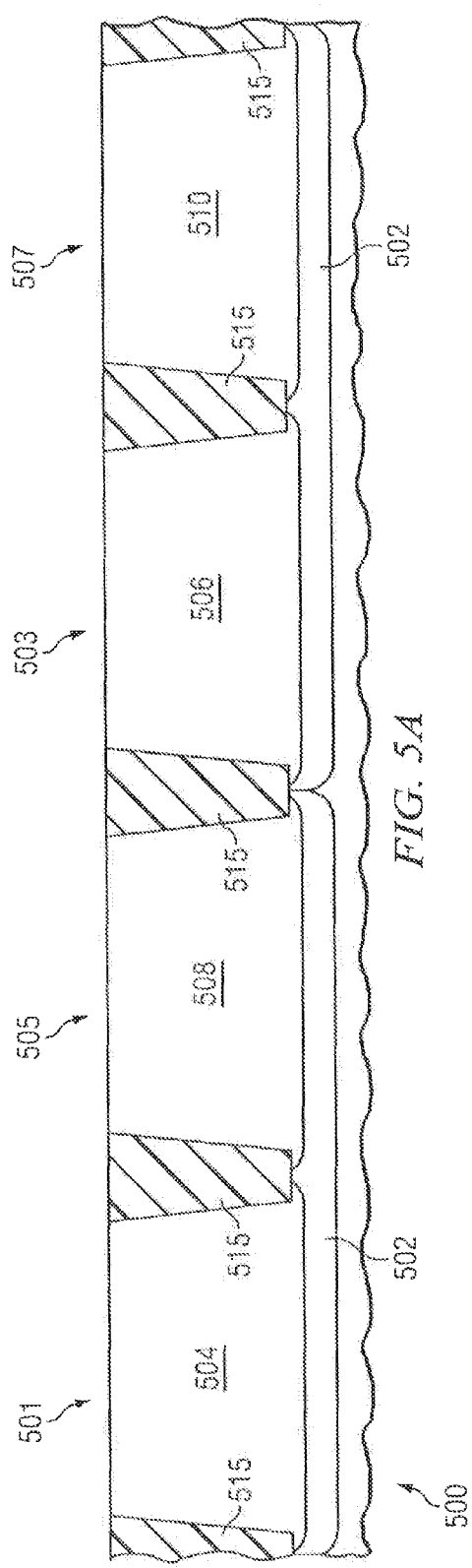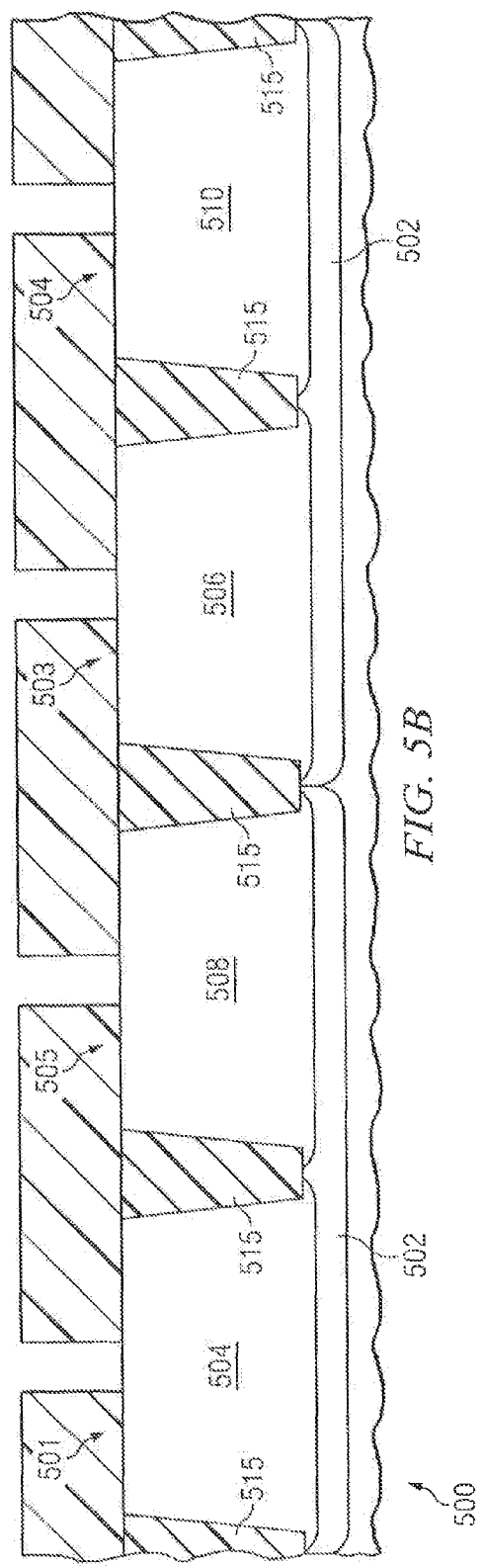
FIG. 5A
FIG. 5B

SEMICONDUCTOR STRUCTURE AND METHOD OF FABRICATION THEREOF WITH MIXED METAL TYPES

CROSS REFERENCE TO RELATED APPLICATIONS

This application is a continuation of U.S. application Ser. No. 12/960,266 filed Dec. 3, 2010, which claims the benefit of U.S. Provisional Application No. 61/357,002 filed Jun. 21, 2010, each of which is hereby incorporated by reference herein.

TECHNICAL FIELD

The present disclosure relates in general to semiconductor processing and more particularly to a structure and method for fabrication thereof providing mixed gate metals.

BACKGROUND

Gate depletion issues, high gate resistance, high gate tunneling currents, and boron penetration into a channel are problems encountered when heavily doped polysilicon gates of conventional CMOS transistors are shrunk. Some of these problems can be eliminated or greatly reduced by use of metal gates. A metal gate eliminates polysilicon gate depletion and boron penetration from the polysilicon into the channel, and also reduces the gate sheet resistance.

However, simply replacing the polysilicon gate with a metal gate is not generally possible, in part because of the different required gate work function for effective operation of PMOS and NMOS transistors. To control short channel effects and keep off-current low, a higher than poly gate work function is required for NMOS and a lower than p+ poly gate work function is required for PMOS, Switching between a polysilicon gate work function suitable for a PMOS transistor and one suitable for an NMOS transistor requires only a minor change to the polysilicon dopant implant process. In contrast, if a mid-gap metal having a work function intermediate to the PMOS and NMOS transistors is selected as a gate metal, a transistor designer must deal with a high threshold voltage. For example, a mid-gap metal having work function around silicon's mid gap value of about 4.6 eV could be selected to provide symmetric benefit to both PMOS and NMOS transistors. Such work function would result in threshold voltages too high to be acceptable for high performance logic applications, unless costly multiple metal post-processing or alloying is used to differentiate the PMOS and NMOS gate work functions.

Because of such problems, transistor designers have utilized two metals having differing work functions that are respectively appropriate for PMOS and NMOS transistors. For example, a conventional high-k/metal gate implementation can utilize a metal that works for NMOS (typically with a work function between 4.05 eV and 4.6 CV) and a metal that works with PMOS (typically of work function between 4.6 eV and 5.2 eV). Common NMOS metals include tantalum silicon nitride (TaSiN), titanium nitride (TiN), or tantalum nitride (TaN), all of which have a work function close to the silicon conduction band. PMOS metals include ruthenium (Ru), molybdenum (Mo), or tungsten (W), all of which have work functions close to the silicon valence band.

While dual metal gate transistors can be produced cost effectively for die composed of a single device transistor type, the situation is not as clear for complex a system-on-a-chip (SoC) die having multiple transistor types. A system-on-a-chip die can require multiple types of digital and analog transistors to handle low and high speed logic, memory, wireless, and input/output functions. Each device type may have a different required set of PMOS and NMOS gate metals for optimal operation. If only two metals are used for all device types, performance compromises must be made, and certain types of devices may be incompatible with each other. However, requiring expensive additional masking and processing steps to deposit multiple sets of gate metal for each device type is costly, time-consuming, and results in increased failure rate.

SUMMARY

From the foregoing, it may be appreciated by those skilled in the art that a need has arisen to provide multiple devices with varying characteristics while reducing masking steps to obtain the multiple devices. In accordance with the present disclosure, a structure with multiple devices and method of fabrication thereof are provided that substantially eliminate or greatly reduce disadvantages and problems found in conventional semiconductor processing techniques.

According to an embodiment of the present disclosure, a semiconductor structure is provided that includes a first PMOS transistor element having a gate region with a first metal associated with a PMOS work function and a first NMOS transistor element having a gate region with a second metal associated with a NMOS work function. The first PMOS transistor element and the first NMOS transistor element form a first CMOS device. The semiconductor structure includes a second PMOS transistor element has a gate region with the second gate metal and a second NMOS transistor element having a gate region with the first gate metal. The second PMOS transistor element and the second NMOS transistor element form a second CMOS device with different operating characteristics than the first CMOS device.

The present disclosure provides various technical advantages over devices and fabrication techniques of conventional semiconductor fabrication processes. For example, one technical advantage is in providing high performance devices on a same substrate with low power devices. Another technical advantage is to provide a first NMOS transistor element with a NMOS work function, a first PMOS transistor element with a PMOS work function, a second NMOS transistor element with the PMOS work function, and a second NMOS transistor element with the PMOS work function. Yet another technical advantage is to provide four different transistor elements using two different gate metals in order to have two CMOS devices with varying characteristics. Embodiments of the present disclosure may enjoy some, all, or none of these advantages. Other technical advantages may be readily apparent to one skilled in the art from the following figures, description, and claims.

BRIEF DESCRIPTION OF THE DRAWINGS

For a more complete understanding of the present disclosure, reference is made to the following description taken in conjunction with the accompanying drawings, wherein like reference numerals represent like parts, in which:

FIGS. 3A-3H illustrate the changes in the structure of the multiple devices during the fabrication process of the first embodiment;

FIGS. 5A-5E illustrate the changes in the structure of the multiple devices during the fabrication process of the second embodiment;

DETAILED DESCRIPTION

Figure 1:
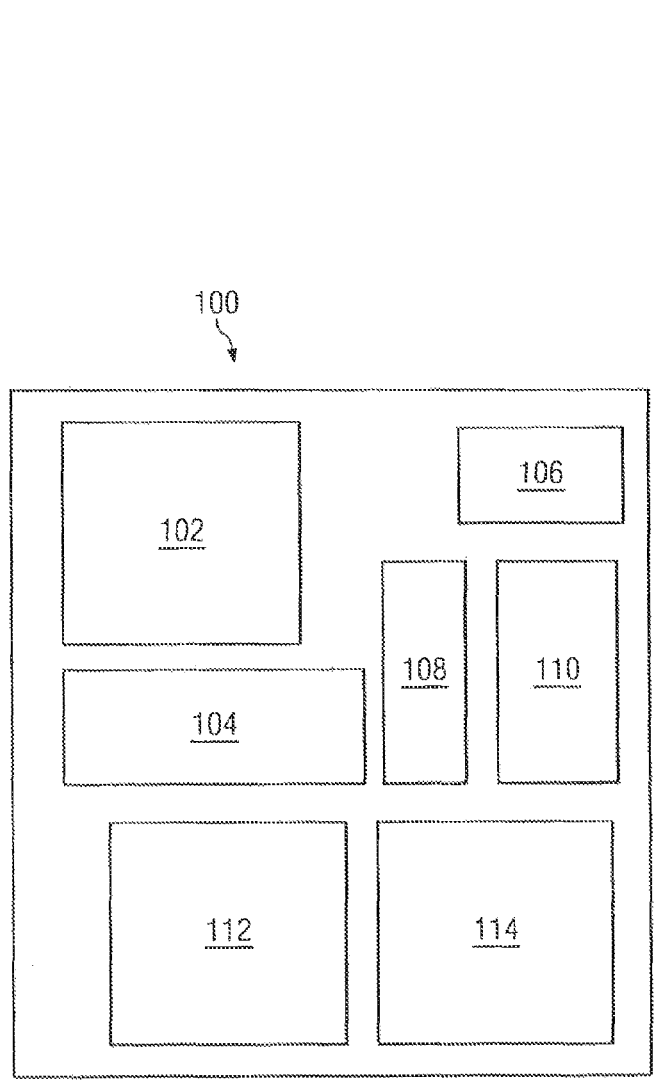
FIG. 1 illustrates a block diagram of a system on a chip having multiple device types.

FIG. 1 shows a block diagram of a system on a chip 100. Support of multiple device types on a single die diced from a single wafer is often required for high density integration of electronic devices. Common device types can include various combinations of digital or analog transistors that have distinct performance requirements, and require differing structure, voltage, and interconnect conditions for operation. Often called a system-on-a-chip (SoC), such integrated circuit die offer smaller size, improved performance, and lower power usage than systems that use multiple integrated circuit packages electrically connected together by motherboard, stack package, or through silicon via interconnects.

As seen in FIG. 1, a variety of different devices can exist on a single SoC 100. The SoC 100 may include conventional digital logic devices 104, analog devices 108, and conventional input 102 and output 106, high and low voltage threshold ($V_T$) devices 112 and 114, and possibly other devices 110, which may be interconnected to each other within the die via a common bus, wire traces, or other suitable interconnections. The device types can differ, for example, in size, operating voltage, switching speed, threshold voltage, applied body bias, source and drain dopant implants, gate stack dielectric materials, gate metals, or digital or analog operation. The devices are preferably formed or otherwise processed as hulk CMOS on a common substrate (as opposed to silicon-on-insulator), typically silicon or other similar substrate, and are often used in computing devices, embedded control systems, integrated wireless controllers, cell phones, network routers or wireless points, sensors, mechanical or electrical controllers, or the like.

As compared to manufacture of a die with a single device type, multiple devices typically requires substantially more mask steps, since the different device types are constructed using differing process conditions. Regions of the die having one kind of device type must be masked to protect them from damage during processing of regions of the die having a second kind of device type. Typically, each additional device type requires at least one additional mask step, and can require even more depending on process compatibility of various devices. Since each additional mask step used to process a die of a semiconductor wafer increases cost, processing time, and possibility of manufacturing error, improvements that minimize the required number of mask steps are useful.

One procedure for minimizing mask steps can take advantage of device type differentiation by metal gate selection. Certain mask steps can be eliminated or substantially reduced by swapping the PMOS and NMOS metals between device types. For example, a semiconductor die can be processed to have a first device type that has a first PMOS transistor element with a metal gate $M_1$ and a first NMOS transistor element with a metal gate $M_2$. Instead of using a different metal $N_3$ or additional process masking steps, a second device type on the same die can be processed to form a second PMOS transistor element with a metal gate $M_2$ and a second NMOS transistor element with a metal gate $M_1$. In effect, the respective PMOS and NMOS gate metals are swapped between device types, with the differing metal gate work functions resulting in different device types. Processing is simplified because an NMOS gate of a first CMOS device can be simultaneously built with a PMOS gate of a second CMOS device. Similarly, a PMOS gate of the first CMOS device can be simultaneously built with a NMOS gate of the second CMOS device. Table I shows various combinations of gate metals and two different device types each having NMOS and PMOS transistor elements,

TABLE I

| Device type | Gate Metal type |
| --- | --- |
| Device 1 - NMOS transistor | M1 (NMOS work function) |
| Device 1 - PMOS transistor | M2 (PMOS work function) |
| Device 2 - NMOS transistor | M2 (PMOS work function) |
| Device 2 - PMOS transistor | M1 (NMOS work function) |

This can be extended to larger numbers of devices with various possible combinations of gate metals providing different device types, each having NMOS and PMOS transistors.

Swapping metals can be optional, with certain combinations of device types and NMOS PHOS transistors having the same metal selection. In other situations, devices may have the same composition of materials but with different percentages of materials used. The present disclosure contemplates the use of any material for the gate regions of the transistor elements as long as a variation in work function, of at least approximately 100 millivolts as an example, is achieved between devices where desired. A masking step is used to expose those PMOS and NMOS transistor elements desired to have a first gate metal with a NMOS work function. The mask is then stripped away to expose the remaining PMOS and NMOS transistor elements desired to have a second gate metal with a PMOS work function. Though not necessary as the second metal gate can be formed on top of the first metal gate without changing transistor element performance, another masking step may be used to cover the transistor elements filled with the first gate metal. When using a third gate metal and a fourth gate metal and beyond, additional masking steps are only needed to ensure that each transistor element is initially filled with the desired gate metal.

Typically, the gate metal used provides a non-semiconductive material with a work function that approximates the work function of a semiconductive material that is doped to be of the same conductivity type. For example, a typical CMOS device may be formed with an n-channel transistor element having a tantalum-based gate electrode with a work function approximately the same as n-doped polysilicon. A p-channel transistor element of the CMOS device may be formed with a tantalum nitride-based gate electrode with a work function approximately the same as p-doped polysilicon. By swapping the gate metals, a second CMOS device may be concurrently formed having an n-channel transistor element with the tantalum nitride-based gate electrode with a work function approximately the same as p-doped polysilicon. Similarly, the second CMOS device can be concurrently formed with the p-channel transistor element having a tantalum-based gate electrode with a work function approximately the same as n-doped polysilicon. Metals that provide a NMOS work function between 4.1 eV and 4.3 eV include aluminum, titanium, and tantalum. Metals that provide a PMOS work function between 4.8 eV and 5.1 eV include nickel, platinum, and iridium. Through the use of alloying, larger ranges of work function can be achieved. The range of interest for transistor element work function is from band-edge to band-edge or 4.0 eV to 5.2 eV. However, effective work functions are somewhat removed from the band-edges. Such work functions range from about 4.2 eV to midgap for NMOS and midgap to 5.0 eV for PMOS. Thus, the use of appropriate metals and alloying can be used to tune the work function in a full range from band-edge to band-edge and provide a work function within hundreds of millivolts of a band-edge or from the midgap. It is contemplated that improved device performance can be achieved at about 300 millivolts from midgap though the use of differing performance characteristics may be desired throughout the full range.

Figure 2:
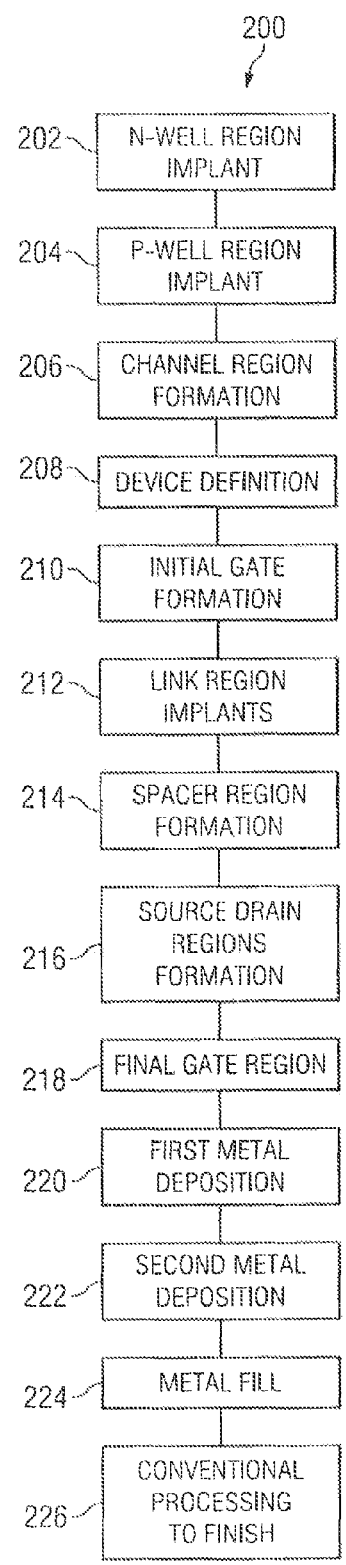
FIG. 2 illustrates an example process flow for fabricating multiple devices on a chip according to a first embodiment.
Figure 3G:
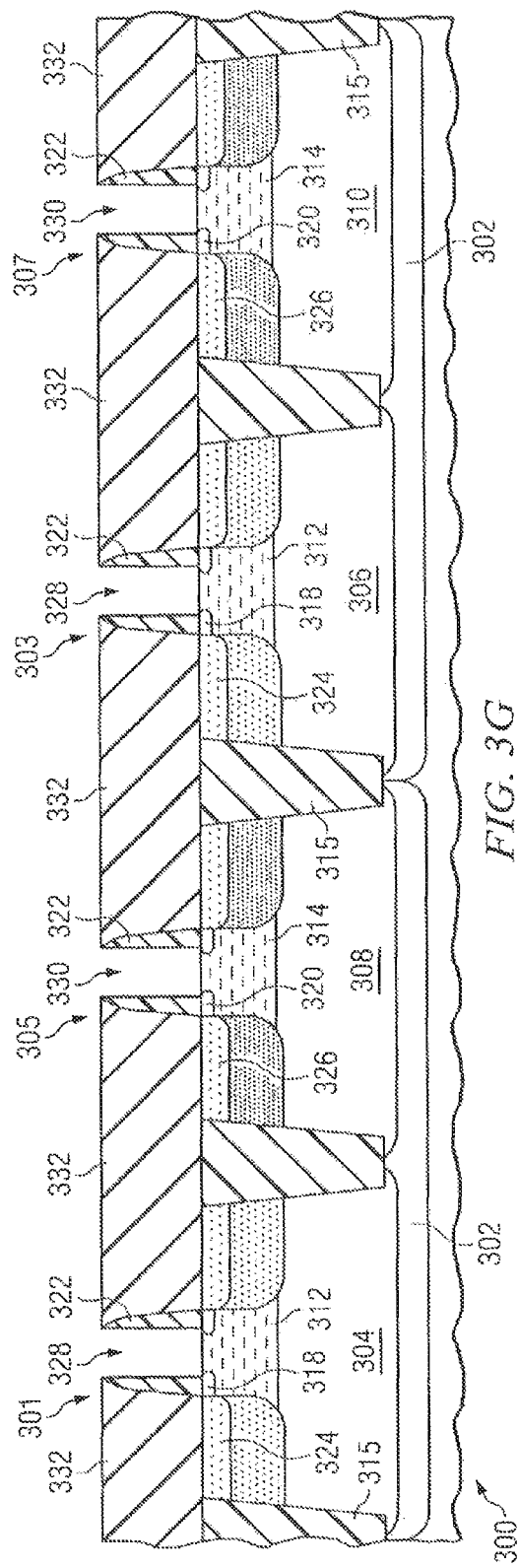
Figure 3H:
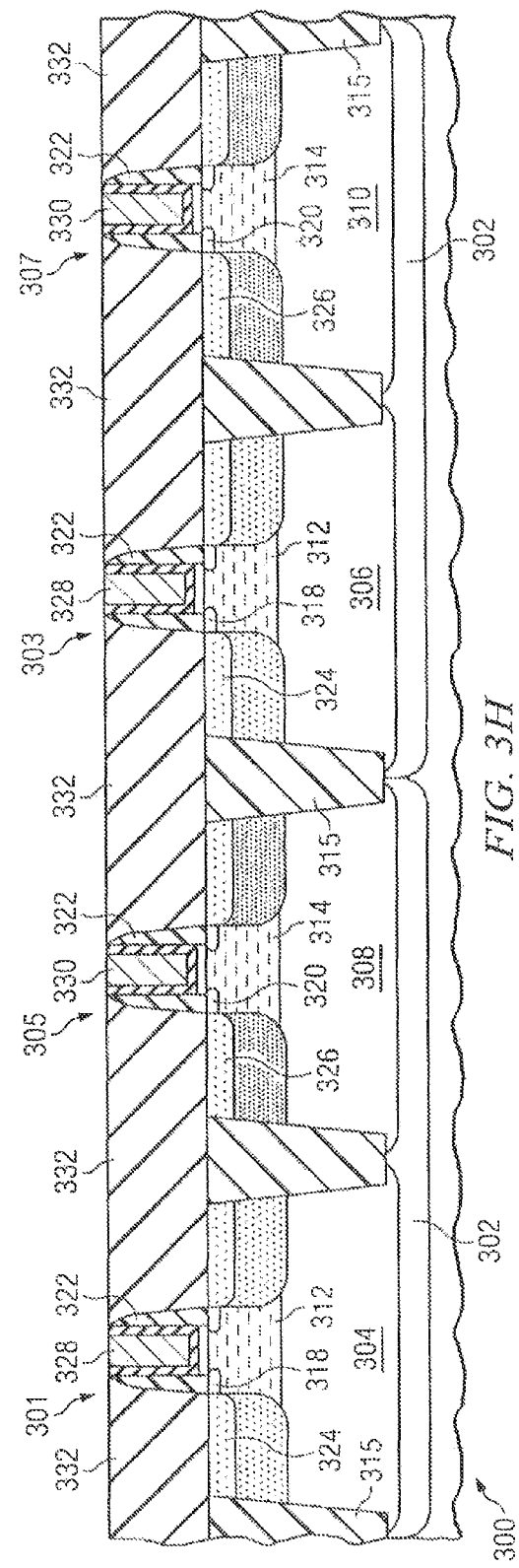

FIG. 2 shows one example of fabrication process 200 for manufacturing a transistors according to an embodiment of the present disclosure. FIGS. 3A-3H show the resulting structure 300 after each process step. The process begins in block 202 by implanting N-well regions 304 and 306 into a substrate 302 for PMOS transistor elements 301 and 303. Conventional photoresist techniques may be performed to mask desired portions of substrate 302 and expose desired implant areas for the N-well regions 304 and 306. The process continues in block 204 where P-well regions 308 and 310 are implanted into substrate 302 for NMOS transistor elements 305 and 307. Conventional photoresist techniques may be performed to mask desired portions of substrate 302 and expose desired implant areas for the P-well regions 308 and 310. PMOS transistor element 301 and NMOS transistor element 305 form a first device and NMOS transistor element 307 and PMOS transistor element 303 form a second device.

The process continues at block 206 with the formation of channel regions 312 and 314 appropriate for each of PMOS transistor elements 301 and 303 and NMOS transistor elements 305 and 307. Device definition and separation may be achieved at block 208 by forming separation regions 315 in structure 300, for example through shallow trench isolation. Initial gate formation occurs at block 210 where a polysilicon region is deposited on structure 300 and etched away where appropriate to leave initial gate areas 316. Link regions 318 and 320 appropriate for each PMOS transistor elements 301 and 303 and NMOS transistor elements 305 and 307 are implanted into channel region 312 at block 212. Spacer regions 322 may then be formed at block 214 abutting initial gate areas 316 to prevent source/drain to body silicidation shorting. Source and drain regions 324 and 326 are then implanted at block 216 through link regions 318 and 320 and channel regions 312 and 314 for each of PMOS transistor elements 301 and 303 and NMOS transistor elements 305 and 307. Conventional annealing steps may be performed at each implant step as desired.

Formation of the final gate regions 328 and 330 begin at block 218 by depositing a salicide layer 332 and then removing the initial gate areas 316. Work function metal deposition for PMOS transistor element 301 and NMOS transistor element 307 is performed at block 220. Work function metal deposition for NMOS transistor element 305 and PMOS transistor element 303 is performed at block 222. Metal fill deposition and polish is performed at block 224 to define final gate regions 328 and 330. A first metal type is used for PMOS transistor element 301 and NMOS transistor element 307. A second metal type is used for NMOS transistor element 305 and PMOS transistor element 303. Conventional processing is then performed at block 226 to obtain the final structures for PMOS transistor elements 301 and 303 and NMOS transistor elements 305 and 307.

Though described as process steps performed in a stated order, particular process steps may be performed at different points in the process flow and in a different order with respect to other process steps as desired to achieve a similar final structure design.

Figure 4:
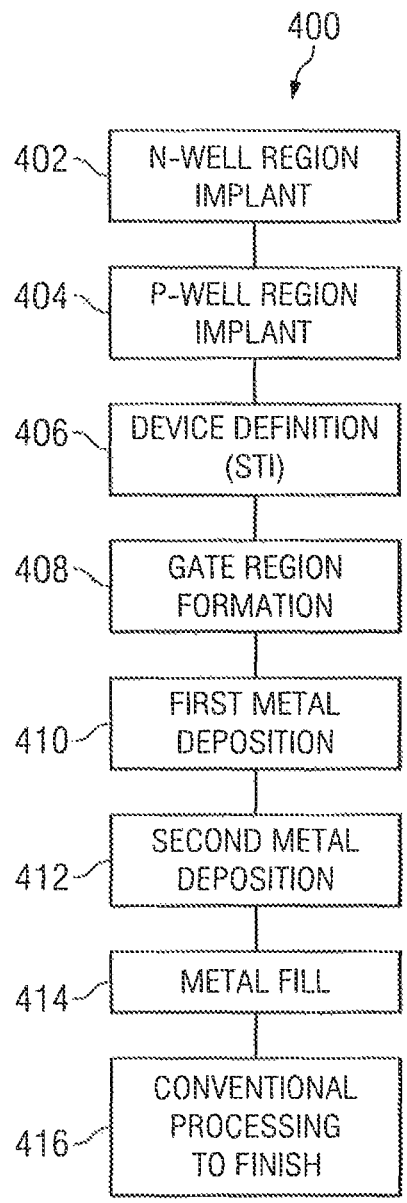
FIG. 4 illustrates an example process flow for fabricating multiple devices on a chip according to a second embodiment.
Figure 5C:
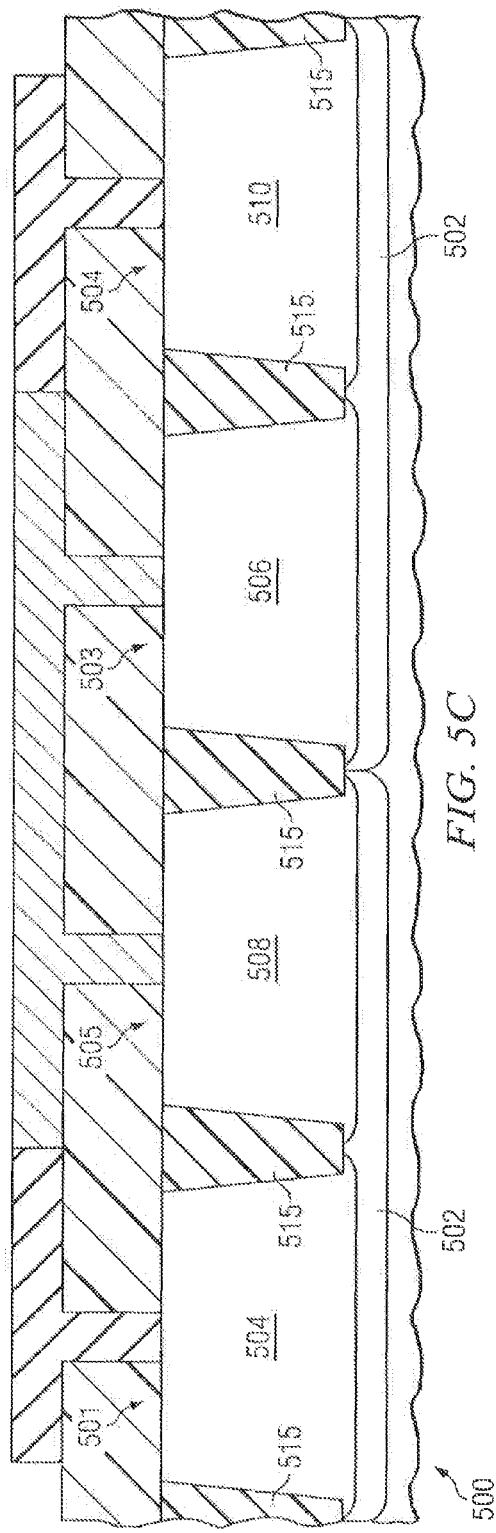
Figure 5D:
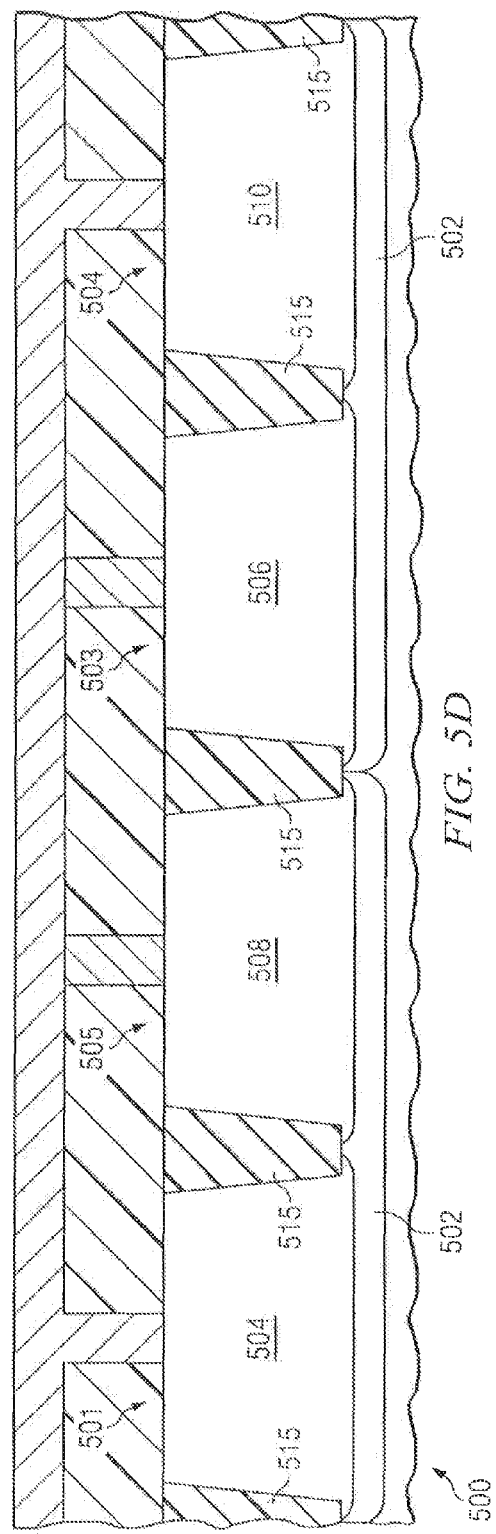
Figure 5E:
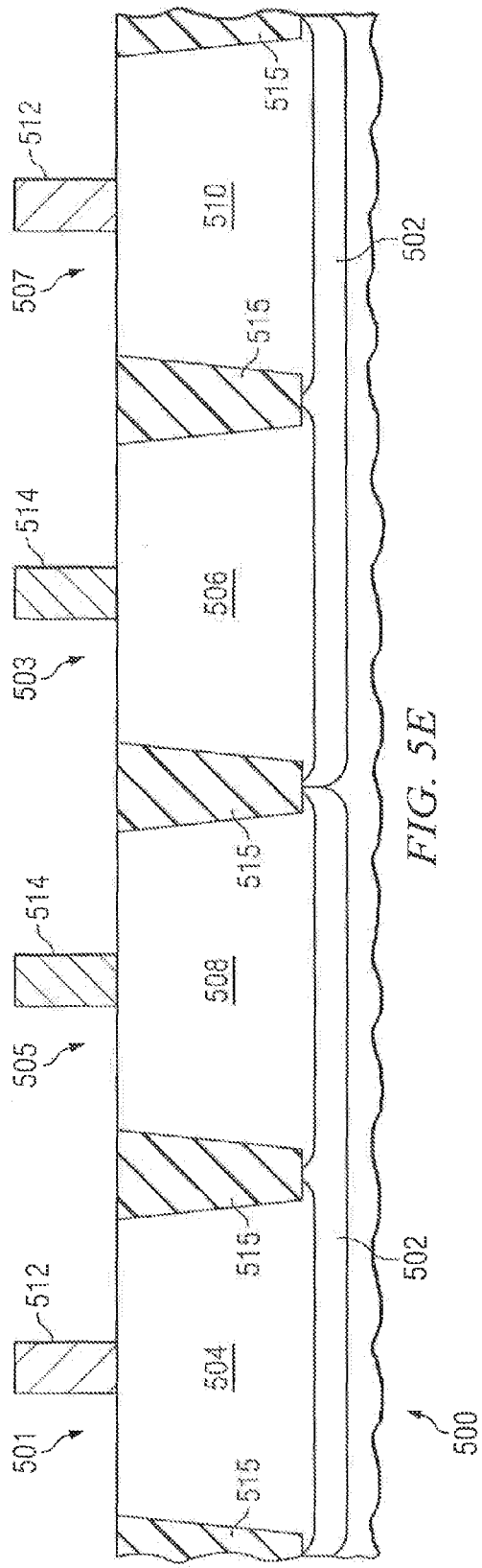

For example, the present disclosure also contemplates a gate first fabrication process. FIG. 4 shows the process steps 400 for generating transistor elements by first forming the gates of the transistor elements. FIGS. 5A-5E show the resulting structure 500 after each process step. The process begins in block 402 by implanting N-well regions 504 and 506 into a substrate 502 for PMOS transistor elements 501 and 503. Conventional photoresist techniques may be performed to mask desired portions of substrate 502 and expose desired implant areas for the N-well regions 504 and 506. The process continues in block 404 where P-well regions 508 and 510 are implanted into substrate 502 for NMOS transistor elements 505 and 507. Conventional photoresist techniques may be performed to mask desired portions of substrate 502 and expose desired implant areas for the P-well regions 508 and 510. PMOS transistor element 501 and NMOS transistor element 505 form a first transistor pair and NMOS transistor element 505 and PMOS transistor element 503 form a second transistor pair.

Device definition and separation may be achieved at block 406 by forming separation regions 515 in structure 500, for example through shallow trench isolation. Formation of metal gate regions 512 and 514 begins at block 408 by appropriate poly deposition, etching to define the gate regions, masking of desired transistor element areas, and metal deposition. In this example, PMOS transistor element 501 and NMOS transistor element 507 will have a first metal type for their respective gate electrode. NMOS transistor element 505 and PMOS transistor element 503 will have a second metal type for their respective gate electrodes.

Work function metal deposition for PMOS transistor element 501 and NMOS transistor element 507 is performed at block 410 with, for example, a PMOS work function metal. Work function metal deposition for NMOS transistor element 505 and PMOS transistor element 503 is performed at block 412 with, for example, a NMOS work function metal. Any other metal fill deposition and polish is performed at block 414 to define gate regions 512 and 514. Conventional processing is then performed at block 416 to obtain the final structures for PMOS transistor elements 501 and 503 and NMOS transistor elements 505 and 507.

Additional process steps may also be performed in order to provide different transistor characteristics. For example, channel regions 312 and 314 may be formed by traditional ion implantation processes. Alternatively, channel regions 312 and 314 may be formed as a substantially undoped layer of silicon, silicon germanium, or other suitable material epitaxially grown on substrate 302 or otherwise formed thereon or therein. The undoped channel layer is not subjected to dopant implantation and is considered undoped as long as the dopant concentration is less than $5 \times 10^{17}$ atoms/cm$^3$.

Figure 6:
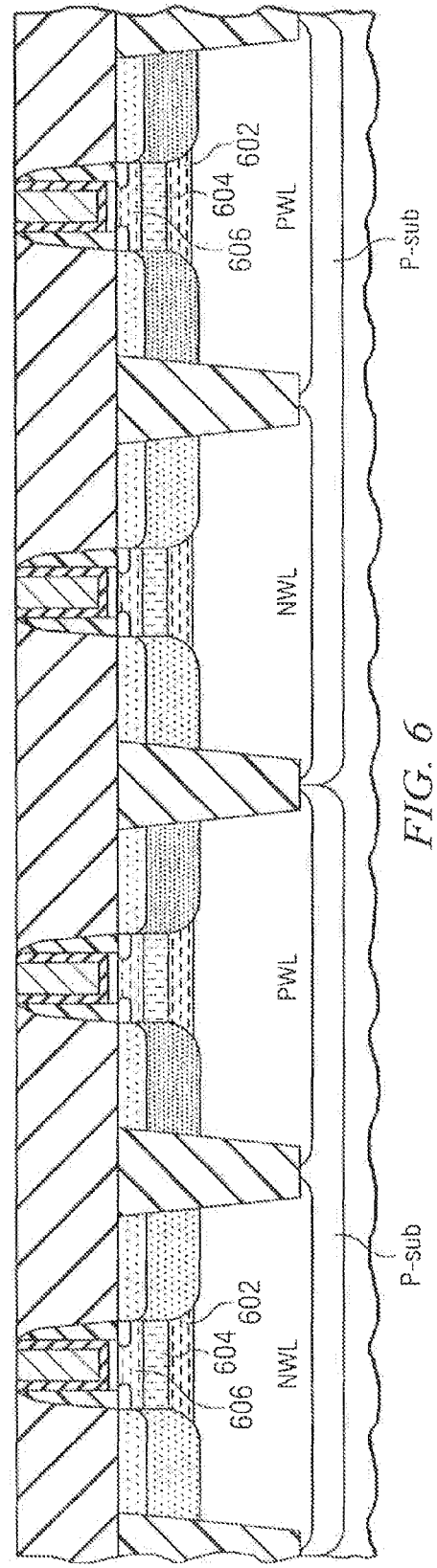
FIG. 6 illustrates the structure with a channel region having a screening region, a threshold voltage setting region, and an undoped channel layer.

FIG. 6 shows an alternative formation for a channel in any of PMOS transistor elements 301 and 305 and NMOS transistor elements 303 and 307. A deeply depleted channel may be implemented that includes a screening region 602, a threshold voltage setting region 604, and an undoped channel region 606. The threshold voltage setting region 604 can be formed as a layer offset from both the screening region 602 and the undoped channel region 606. Such an offset layer can be formed by delta doping, implant into epitaxially grown layers, atomic layer deposition, or other available techniques for forming a well-defined dopant layer with a dopant concentration less than that of screening region 602. In certain embodiments, threshold voltage setting region 606, while being formed by implant, in-situ growth, or controlled diffusion from screening region 602, may be in contact with screening region 602.

In certain cases, the use of the described threshold voltage setting region 604 and/or undoped channel region 606 and screening region 602 may be required for device operation. For example, in advanced nodes the chip supply voltage is often about one (1) volt, and a PMOS/NMOS metal swap between devices without additional significant threshold voltage adjustment can result some devices having an unacceptably high threshold voltages near or greater than 1 volt. This would result in a failure of the transistor to turn on or off, which in turn could result in failure of the system on the chip or system electronics. Even if the threshold voltage is nominally set lower than the supply voltage by appropriate metal selections, if the threshold voltage distribution range is not tightly controlled by use of the described threshold voltage setting region 604 and/or undoped channel region 606 and screening region 602, there is a large probability of system failure (due to an anomalously high threshold voltage device) when statistical variations in threshold voltage of millions or billions of devices are considered.

Formation of these regions that enable statistically well-controlled threshold voltage variation and allow for significant threshold voltage adjustments, may be performed during formation of the channel regions 312 and 314 in FIG. 3B at block 206 of FIG. 2. Screening region 602 is a heavily doped region formed in the associated well region. Screening region 602 has a greater dopant concentration than the associated well region. Screening region 602 reduces any additional charges that may be created by random dopant variation in threshold voltage setting region 604. Screening region 602 creates image charges that negate fixed charges associated with threshold voltage setting region 604. By reducing this additional charge in threshold voltage setting region 604, the variation of the threshold voltage can be reduced. Furthermore, forming threshold voltage setting region 604 in an offset region from both undoped channel region 606 and a gate dielectric has several advantages. One advantage is the threshold voltage can be tuned over a wide range without degrading the statistical spread in the distribution (sigma $V_T$). The second advantage of placing dopants in an offset region results from nearly constant short channel effects even when random dopant fluctuations occur in threshold voltage setting region 604. In contrast to devices having doped channels, undoped channel devices with offset threshold voltage setting regions 604 will provide nearly constant sub-threshold swing (typically about 80 to 110 mv/decade) device to device, even for a large number of transistors, since random dopant fluctuations are minimized.

Threshold voltage setting region 604 is used to set the threshold voltage for the particular transistor element based in part on the number of dopants implanted therein. For example, various combinations of transistor elements may be formed. For advanced semiconductor process nodes with 65 nm gate length and below, low $V_T$ transistor element may be formed with a dopant concentration in the range of $0.5 \times 10^{18}$ to $1.5 \times 10^{18}$ atoms/cm$^3$. A medium $V_T$ transistor element may be formed with a dopant concentration in the range of $1.5 \times 10^{18}$ to $3.0 \times 10^{18}$ atoms/cm$^3$. A high $V_T$ transistor element may be formed with a dopant concentration in the range of $3.0 \times 10^{18}$ to $6.0 \times 10^{18}$ atoms/cm$^3$. These dopant concentrations can be reduced by 25% to 50% while maintaining the appropriate threshold voltage through the use of an appropriate work function of the gate metal. Swapping the gate metals, for example by providing a first gate metal with a PMOS work function in a NMOS transistor element, allows for further flexibility in establishing the threshold voltage for the transistor element.

Figure 7:
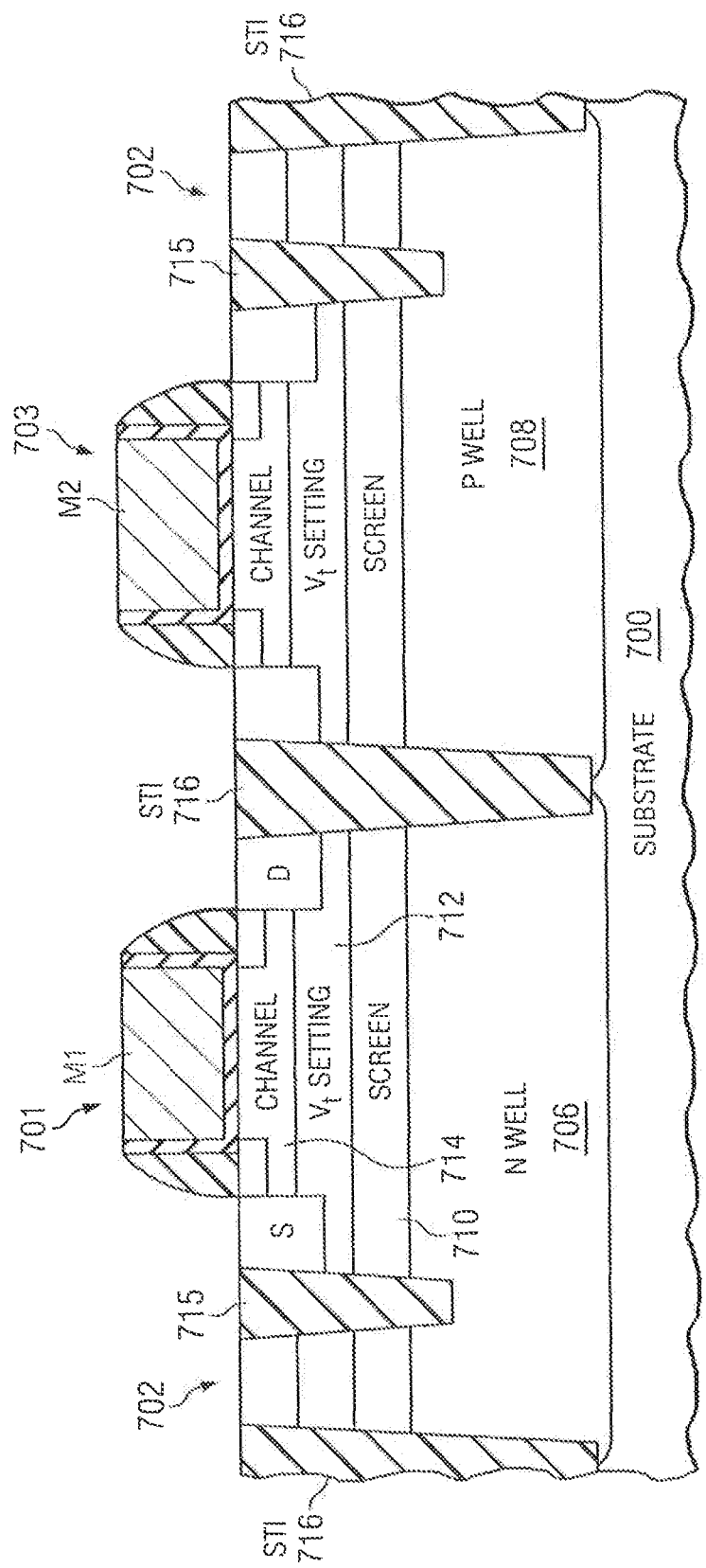
FIG. 7 illustrates the structure with a body tap region.

FIG. 7 shows another embodiment of the structure that includes a body tap region 702 electrically connected to N-well 706 or P-well 708 on substrate 700. A body tap region 702 may be formed with any or all of PMOS transistor elements 701 and 705 (not shown) and NMOS transistor elements 703 and 707 (not shown). Though shown in relation to a channel region having an undoped channel layer 714 over a screening region 710 and a threshold voltage setting region 712, the use of body tap region 702 can be equally implemented with a channel region having a standard channel layer or a single undoped channel layer as described above. In addition to shallow trench isolation (STI) 716, partial isolation region 715 may optionally be used to separate body tap region 702 from its corresponding transistor element. Body tap region 702 allows for additional bias control and can be used in the setting of the threshold voltage. The use of body tap region 702 provides another way of modifying the threshold voltage of the associated transistor element. Through body tap region 702, a same magnitude of threshold voltage adjustment can be achieved as provided with the use of threshold voltage setting region 712 and screening region 710.

Functionally, one result of swapping NMOS and PMOS metals with different work functions between device types is modification of the threshold voltage and off state current of the transistor. As will be appreciated, threshold voltage and off state current are critical parameters in transistor operation, particularly affecting overall device power leakage and transistor switching speed. Low $V_T$ transistors switch quickly with good operating current ($I_{on}$), but typically have high current leakage ($I_{off}$) in off or standby states. High $V_T$ transistors are slower to switch, but typically have low current leakage $I_{off}$ in off or standby states. SoC die can support both types of transistors, grouped into high performance paths or slower access/low power blocks.

Figure 8:
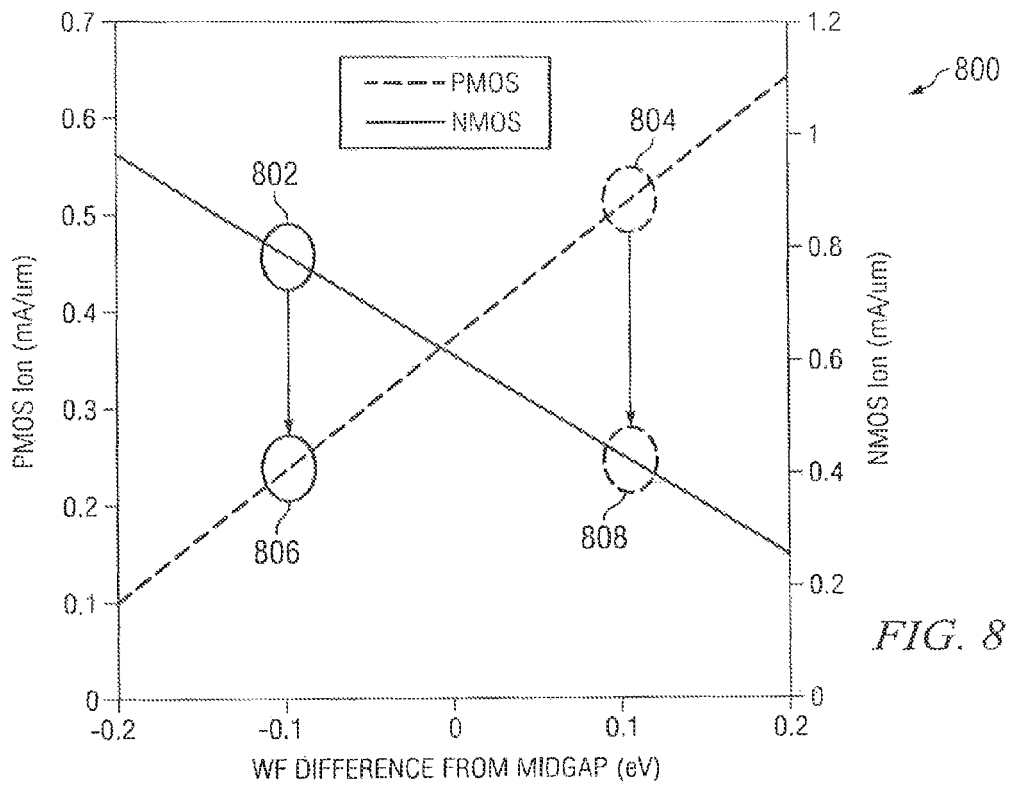
FIG. 8 illustrates a graph providing a relationship between on current and work function difference for each of a PMOS and NMOS transistor element.

The advantage of swapping NMOS and PMOS metals between two device types is illustrated with respect to FIG. 8, which shows a graph 800 with NMOS/PMOS $I_{on}$ versus work function (WF) difference from silicon midgap. The dotted line corresponds to PMOS type transistors, and the solid line corresponds to NMOS type transistors. In FIG. 8, a possible metal selection/gate work function for a first NMOS transistor element is indicated by a solid circle 802, and possible metal selection/gate work function for first PMOS transistor element is indicated by a dotted circle 804. Swapping the PMOS/NMOS metals results in NMOS metal on a second PMOS transistor element as indicated by the solid circle 806, and a PMOS metal on a second NMOS transistor element as indicated by the dotted circle 808.

Figure 9:
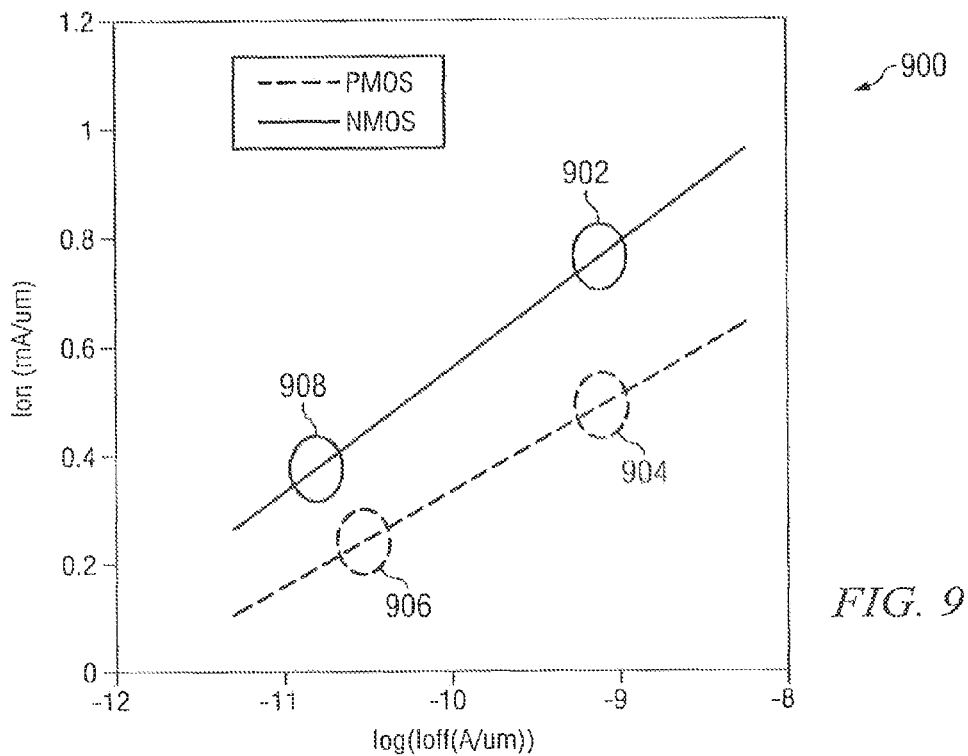
FIG. 9 illustrates a graph providing a relationship between on current and off current with work function difference for each of a PMOS and NMOS transistor element.

Presented alternatively, graph 900 of FIG. 9 shows the data of FIG. 8 represented as $I_{on}$ and $I_{off}$ for the same range of work functions. The dotted line corresponds to PMOS type transistors and the solid line corresponds to NMOS type transistors. In FIG. 9, a possible metal selection/gate work function for a first NMOS transistor element is indicated by a solid circle 902 and 908 and possible metal selection/gate work function for first PMOS transistor element is indicated by a dotted circle 904 and 906. With only two metals, four different device types of greatly differing characteristics can be formed by the NMOS/PMOS swap.

Other advantages can be achieved by the structure disclosed herein. For a given add, the structure enables coexistence of transistors (or circuits) having the usual high $V_T$, medium $V_T$, and low $V_T$ parameters that exist within a 1-40× leakage range with a new set of transistors (or circuits) enabled by the gate metal swap with relative leakages 50× or lower. In addition, a 25% percent reduction in drive current from one device to another is also achieved between transistor sets. For example, a first NMOS transistor element can be formed with a predetermined first leakage while the second NMOS transistor element can be formed with a second leakage that can be ten to fifty times lower than the predetermined first leakage. In addition, a first NMOS transistor element can be formed with a predetermined first drive current while the second NMOS transistor element can be formed with a second drive current that can be three to six times more than the predetermined first drive current.

FIGS. 8 and 9 illustrate the advantage using only two metals to create four different device types of greatly differing characteristics, but this can be extended to greater numbers of device types. Swapping the NMOS/PMOS metals allows up to twice the number of device types without requiring additional mask steps (unless such mask steps are desired to create additional device types). Generally, for some number of metals N selected for a transistor element gate, 2N device types can be simply formed on a Sod; without a substantial increase in processing or mask steps.

As Will be appreciated, by selecting suitable metal/work function for a transistor element's gate, while otherwise keeping device structure and manufacturing processes the same, allows both high performance and low power digital devices, for example, to be economically manufactured on the same die. Alternatively, swapped NMOS/PMOS gate metal can allow digital devices and analog devices to be constructed on the same SoC. Similarly, high linear sensitivity analog devices and analog I/O devices, or deeply depleted digital and analog devices (DDC) in combination with any conventional analog or digital device can be formed. Further improvements can be achieved in threshold voltage shifting capabilities using an undoped channel as opposed to foundry doped channels that limit the threshold voltage shifting range. Moreover, most SoC implementations as shown in FIG. 1 mask out large sections of the substrate in order to isolate devices to certain locations therein. Through selective masking and device formation, adjacent transistor elements on a substrate may be formed with different characteristics to make different device types that may be connected together due to their proximity.

Although the present disclosure has been described in detail with reference to a particular embodiment, it should be understood that various other changes, substitutions, and alterations may be made hereto without departing from the spirit and scope of the appended claims. For example, although the present disclosure includes a description with reference to a specific ordering of processes, other process sequencing may be followed and other incidental process steps may be performed to achieve the end result discussed herein.

Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:

1. A semiconductor structure, comprising;
   first and second PMOS transistor elements and first and second NMOS transistor elements, wherein the first PMOS transistor element and the first NMOS transistor element establish a first CMOS transistor pair, and the second PMOS transistor element and the second NMOS transistor element establish a second CMOS transistor pair;
   a first threshold voltage setting region extending under a gate of at least one of the first and second PMOS transistor elements, the first threshold voltage region defining a depletion zone when a voltage to the transistor elements is applied;
   a second threshold voltage setting region extending under a gate of at least one of the first and second NMOS transistor elements, the second threshold voltage setting region defining a depletion zone when the voltage to the transistor elements is applied;
   a substantially undoped channel region disposed above the first and second threshold voltage setting regions and below the gates of each of the first and second PMOS transistor elements and the first and second NMOS transistor elements;
   only the gate of the first PMOS transistor element of the first CMOS transistor pair and the gate of the second NMOS transistor element of the second CMOS transistor pair comprising a deposited first gate metal; and
   only the gate of the first NMOS transistor element of the first CMOS transistor pair and the gate of the second PMOS transistor element of the second CMOS transistor pair comprising a deposited second gate metal.

2. The structure of claim 1, wherein second gate metal is a modification of the first gate metal.

3. The structure of claim 1, wherein at least one of the first gate metal and the second gate metal has a work function between 100 millivolts from band edge to midgap.

4. The structure of claim 1, wherein at least one of the first gate metal and the second gate metal has a work function selected to be between midgap and 300 millivolts from midgap.

5. The structure of claim 1, further comprising:
   first and second PMOS transistor elements and first and second NJMOS transistor elements, respectively formed after formation of any source and drain regions of the first and second PMOS transistor elements and the first and second NMOS transistor elements.

6. The structure of claim 1, further comprising:
   first and second PMOS transistor elements and first and second NMOS transistor elements, respectively formed prior to formation of any source and drain regions of the first and second PMOS transistor elements and the first and second NMOS transistor elements.

7. The structure of claim 1, further comprising:
   a body tap region connected to at least one of the first and second PMOS transistor elements and first and second NMOS transistor elements to selectively apply a bias thereto.

8. The structure of claim 1, wherein the undoped channel is epitaxially grown silicon.

9. The structure of claim 1, wherein the first NMOS transistor element operates with a predetermined first leakage, the second NMOS transistor element operates with a second leakage at least ten times lower than the predetermined first leakage.

10. The structure of claim 1, wherein the first NMOS transistor element operates with a predetermined first leakage, the second NMOS transistor element operates with a second leakage at least fifty times lower than the predetermined first leakage.

11. The structure of claim 1, further comprising:
a first screening region extending under the gate of the at least one of the first and second PMOS transistor elements and positioned below the first threshold voltage setting region;
a second screening region extending under the gate of the at least one of the first and second NMOS transistor elements and positioned below the second threshold voltage setting region.

12. The structure of claim 11, wherein the first screening region has a higher dopant concentration than the first threshold voltage setting region.

13. The structure of claim 11, wherein the second screening region has a higher dopant concentration than the second threshold voltage setting region.

14. The structure of claim 11, wherein the first threshold voltage setting region is in contact with the first screening region.

15. The structure of claim 11, wherein the second threshold voltage setting region is in contact with the second screening region.

16. The structure of claim 11, wherein the first gate metal includes any of tantalum silicon nitride (TaSiN), titanium nitride (TiN), and tantalum nitride (TaN).

17. The structure of claim 11, wherein the second gate metal includes any of ruthenium (Ru), molybdenum (Mo), or tungsten (W).

18. The structure of claim 11, wherein the first gate metal includes any of aluminum, titanium, tantalum, and alloys thereof.

19. The structure of claim 11, wherein the second gate metal includes any of nickel, platinum, iridium, and alloys thereof.

20. The structure of claim 11, wherein the first gate metal and the second gate metal have a same composition of materials but with different percentages of materials used.

* * * * *